United States Patent
Polcik et al.

(10) Patent No.: US 11,081,325 B2
(45) Date of Patent: Aug. 3, 2021

(54) CONDUCTIVE TARGET MATERIAL

(71) Applicants: PLANSEE SE, Reutte (AT); PLANSEE COMPOSITE MATERIALS GMBH, Lechbruck am See (DE)

(72) Inventors: Peter Polcik, Reutte (AT); Enrico Franzke, Reutte (AT); Marcus Wolff, Rosshaupten (DE)

(73) Assignees: Plansee SE, Reutte (AT); Plansee Composite Materials GmbH, Lechbruck am See (DE)

( * ) Notice: Subject to any disclaimer, the term of this patent is extended or adjusted under 35 U.S.C. 154(b) by 349 days.

(21) Appl. No.: 14/917,094

(22) PCT Filed: Sep. 3, 2014

(86) PCT No.: PCT/AT2014/000166
§ 371 (c)(1),
(2) Date: Mar. 7, 2016

(87) PCT Pub. No.: WO2015/031920
PCT Pub. Date: Mar. 12, 2015

(65) Prior Publication Data
US 2016/0217984 A1  Jul. 28, 2016

(30) Foreign Application Priority Data
Sep. 5, 2013 (AT) .............................. GM 288/2013

(51) Int. Cl.
*H01J 37/34* (2006.01)
*C23C 14/34* (2006.01)
(Continued)

(52) U.S. Cl.
CPC ........ *H01J 37/3429* (2013.01); *C04B 35/447* (2013.01); *C04B 35/645* (2013.01);
(Continued)

(58) Field of Classification Search
CPC . C23C 14/0605; C23C 14/08; C23C 14/3414; C23C 14/0635; C23C 14/0676;
(Continued)

(56) References Cited

U.S. PATENT DOCUMENTS 8,197,781 B2   6/2012   Neudecker et al.
8,426,061 B2   4/2013   Nesper et al.
(Continued)

FOREIGN PATENT DOCUMENTS

CN    102206802 A      10/2011
CN    103401016 A   *  11/2013
(Continued)

OTHER PUBLICATIONS

Bajars, Gunars et al., "Physical and electrochemical properties of LiFePo4/C thin films deposited by direct current and radiofrequency magnetron sputtering." Solid State Ionics 188 (2011) 156-159 (Year: 2011).*
(Continued)

*Primary Examiner* — Michael A Band
(74) *Attorney, Agent, or Firm* — Laurence A. Greenberg; Werner H. Sterner; Ralph E. Locher

(57) ABSTRACT

The present invention relates to a conductive target material comprising essentially one lithium compound, preferably lithium phosphate, and carbon, and also typical impurities. The invention further relates to a process for producing a conductive target material and to the use thereof.

5 Claims, 2 Drawing Sheets

(51) Int. Cl.
    *C23C 14/06*     (2006.01)
    *C04B 35/447*     (2006.01)
    *C04B 35/645*     (2006.01)
    *H01M 10/0562*     (2010.01)
    *H01M 6/40*     (2006.01)
    *C23C 14/14*     (2006.01)
    *H01M 10/0525*     (2010.01)

(52) U.S. Cl.
    CPC ...... *C23C 14/0605* (2013.01); *C23C 14/3414* (2013.01); *C04B 2235/3203* (2013.01); *C04B 2235/422* (2013.01); *C04B 2235/5436* (2013.01); *C04B 2235/5463* (2013.01); *C04B 2235/666* (2013.01); *C04B 2235/94* (2013.01); *C23C 14/14* (2013.01); *H01M 6/40* (2013.01); *H01M 10/0525* (2013.01); *H01M 10/0562* (2013.01); *H01M 2220/30* (2013.01); *H01M 2300/0068* (2013.01)

(58) Field of Classification Search
    CPC ............... H01M 4/5825; H01J 37/3426; H01J 37/3429; C04B 12/025; C04B 14/366; C04B 35/62268; C04B 35/62881; C04B 35/6313; C04B 35/447; C04B 35/645
    See application file for complete search history.

(56) References Cited

U.S. PATENT DOCUMENTS

| | | |
|---|---|---|
| 8,652,305 B2 | 2/2014 | Levasseur et al. |
| 2008/0217162 A1 | 9/2008 | Delrue et al. |
| 2009/0159433 A1 | 6/2009 | Neudecker et al. |
| 2010/0242265 A1 | 9/2010 | Wadley et al. |
| 2010/0264017 A1 | 10/2010 | Nam et al. |
| 2011/0177397 A1 | 7/2011 | Ogasa |

FOREIGN PATENT DOCUMENTS

| | | | |
|---|---|---|---|
| DE | 2122950 A1 | | 12/1971 |
| GB | 1314884 A | | 4/1973 |
| JP | 56063810 A | * | 5/1981 |
| JP | 2004234977 A | | 8/2004 |
| JP | 2005123107 A | * | 5/2005 |
| JP | 2011504546 A | | 2/2011 |
| JP | 2013122080 A | | 6/2013 |
| KR | 20030043177 A | | 6/2003 |
| KR | 1020120019605 A | | 3/2012 |
| TW | 201037884 A | | 10/2010 |
| WO | 2007042394 A1 | | 9/2006 |
| WO | 2008058171 | | 5/2008 |
| WO | 2009153664 A1 | | 12/2009 |
| WO | WO-2010023194 A1 * | 3/2010 | .............. C01B 25/45 |

OTHER PUBLICATIONS

Machine Translation JP2005123107A (Year: 2005).*
Human Translation JP 56063810 A (Year: 1981).*
"Relative Density" definition [https://en.wikipedia.org/wiki/Relative_density].*
Bajars, G. et al., "Physical and electrochemical properties of LiFePO4/C thin films deposited by direct current and radiofrequency magnetron sputtering", Solid State Ionics, Apr. 2011, pp. 156-159, vol. 188, Issue 1, Apr. 22, 2011.
Guo, X., et al., "Capacitive Energy Storage on Fe/Li3PO4 Grain Boundaries", Journal of Physical Chemistry, 2011, pp. 3803-3808, vol. 115, URL: https://www.researchgate.net/publication/231646842_Capacitive_Energy_Storage_on_FeLi3PO4_Grain_Boundaries.

* cited by examiner

FIG. 1
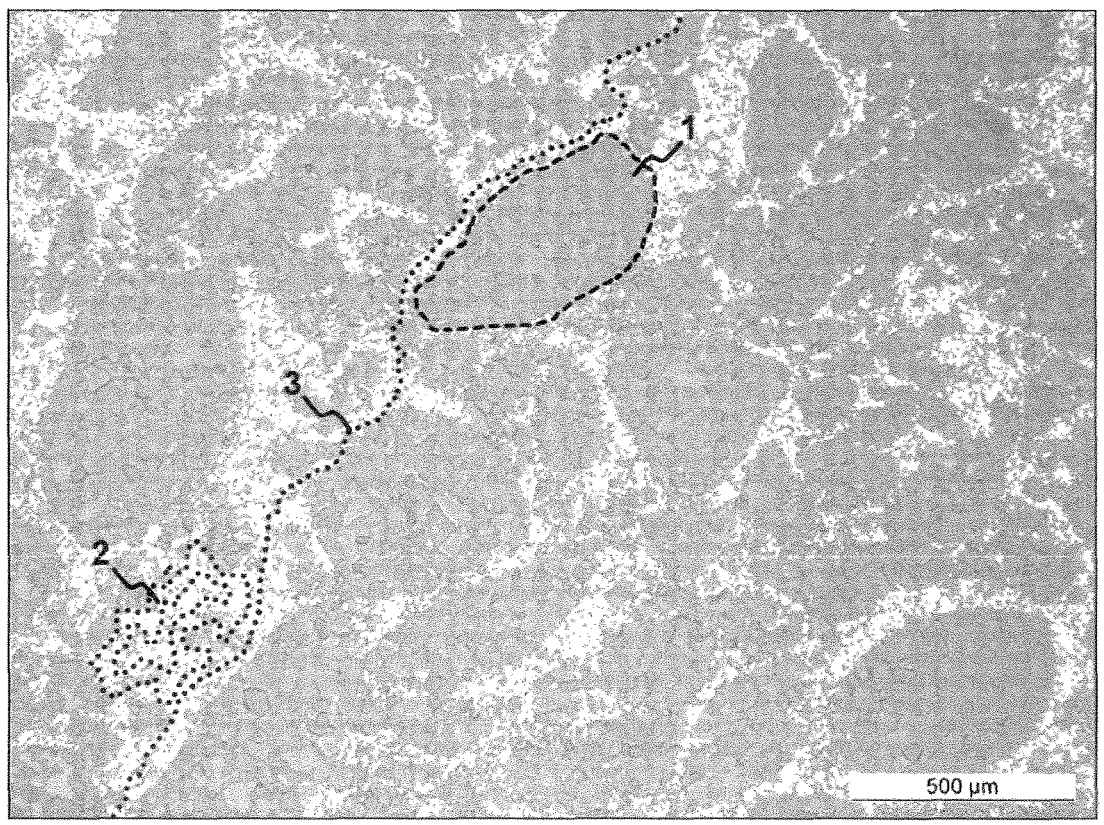
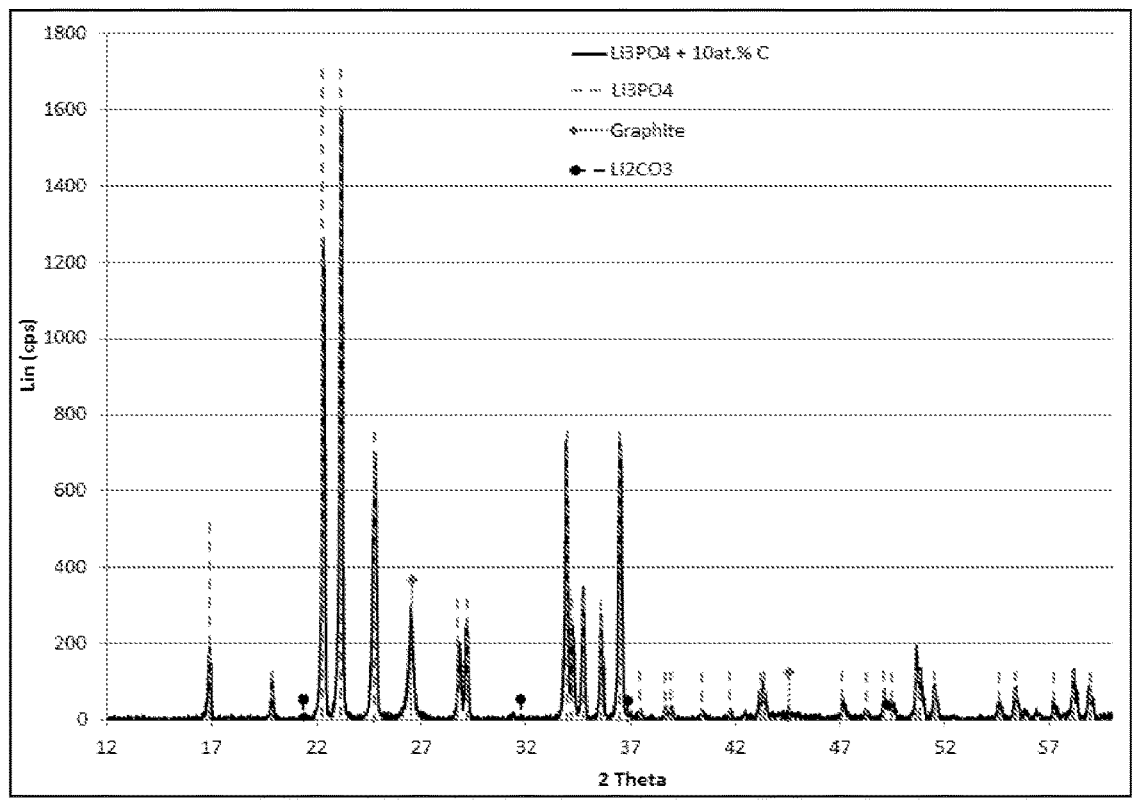
FIG. 2

FIG. 3
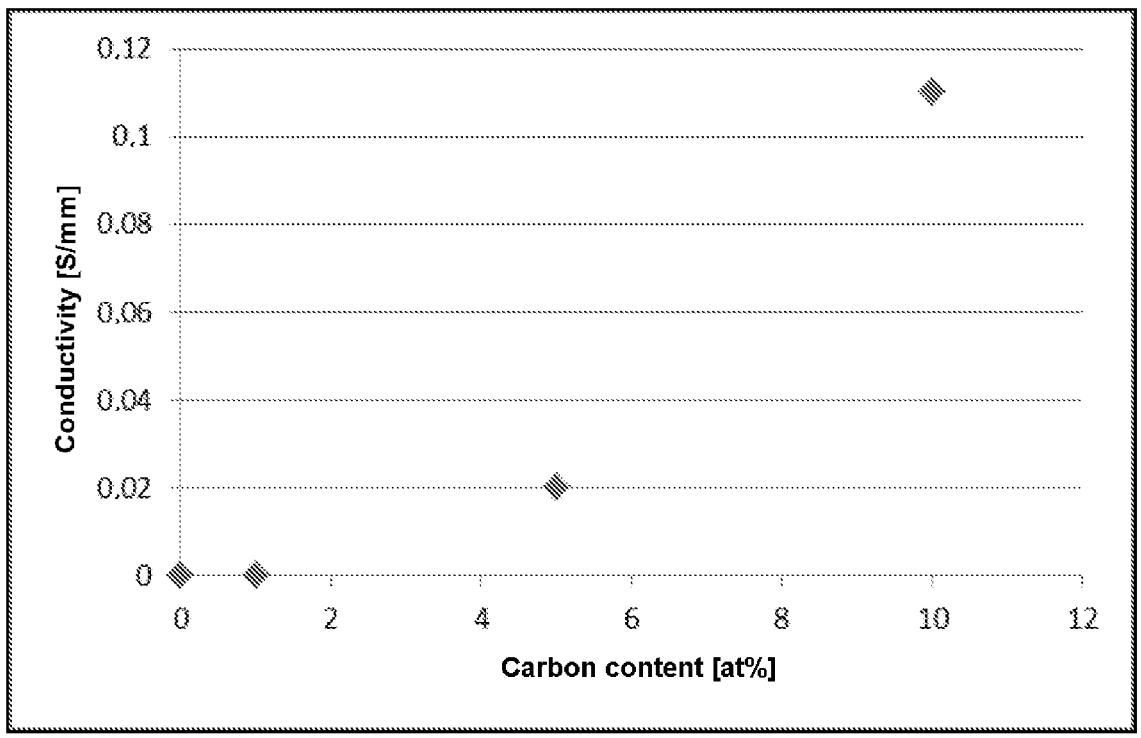
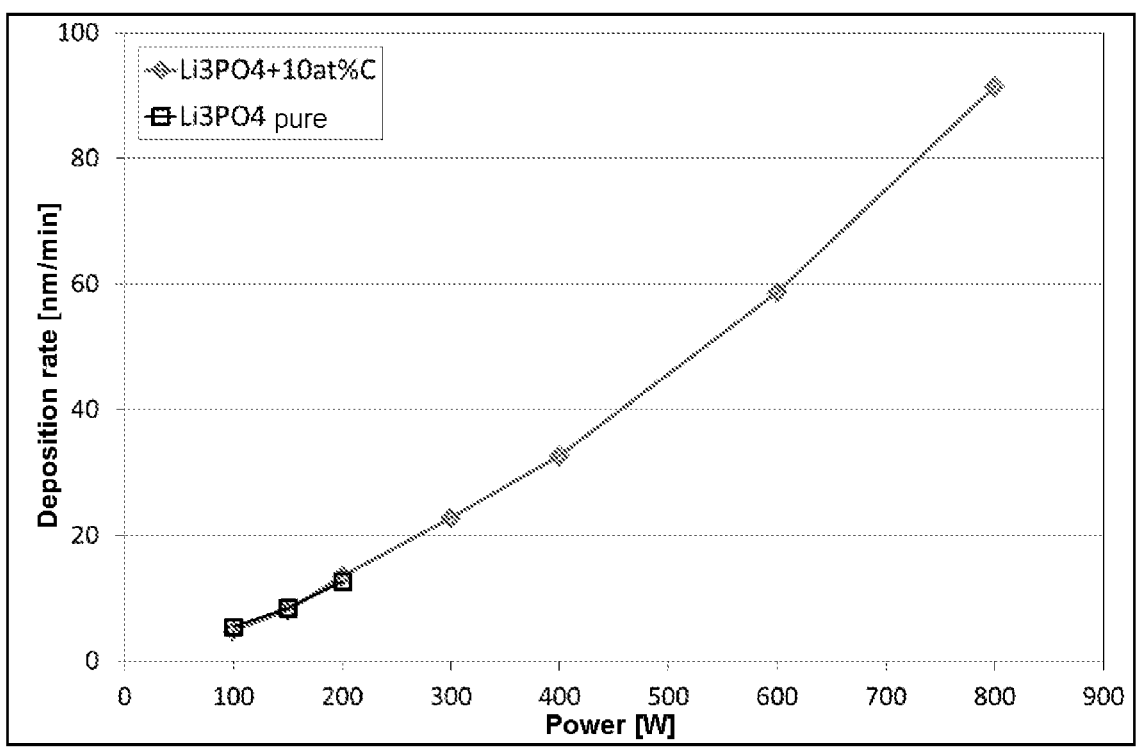
FIG. 4

CONDUCTIVE TARGET MATERIAL

BACKGROUND OF THE INVENTION

Field of the Invention

The present invention relates to a conductive target material comprising essentially one lithium compound, preferably lithium phosphate, and carbon, and also typical impurities. The invention further relates to a process for producing a conductive target material and to the use thereof.

Target materials composed of lithium compounds, for example lithium phosphate ($Li_3PO_4$), lithium lanthanum zirconium oxide ($Li_7La_3Zr_2O_{12}$) or else other Li-containing compounds, for example $Li_3P$, $Li_2O$, $Li_3N$, $LiBO_2$, $Li_2SO_4$, LiI or LiBP, or else composite materials containing Li compounds, for example $Li_2SO_4$—$SiS_2$—$P_2S_5$, are used in physical vapour deposition (PVD) systems for deposition of lithium ion electrolyte layers. Layers deposited in this way find use in the production of thin-film batteries, where the lithium ion electrolyte layers deposited are to have a very low electrical conductivity, and are preferably to be electrically insulating. The suitability thereof as electrolyte layers arises from the conductivity thereof for ions.

In general, the deposition of such lithium ion electrolyte layers is accomplished by means of an RF/HF (radio frequency/high frequency) reactive sputtering process; for example, the sputtering of a lithium phosphate target with the involvement of nitrogen and/or oxygen during the deposition operation forms nitrogen-containing LiPON layers having a high ion conductivity. Conventional monophasic target materials composed of lithium compounds, especially lithium phosphate, and the use thereof for production of lithium ion electrolyte layers are described, for example, in WO 2008 58171 A2.

Of course, it is likewise possible to produce further types of lithium ion electrolyte layers as well by the deposition of corresponding target materials. However, the low electrical conductivity of conventional target materials composed of lithium compounds, for example lithium phosphate ($Li_3PO_4$), greatly restricts the use of DC (direct current) and pulsed DC sputtering processes, and hence limits the achievable deposition rates for lithium ion electrolyte layers produced. Fully insulating target materials cannot be deposited via DC and pulsed DC sputtering.

Conductive target materials which can subsequently also be used in DC or pulsed DC sputtering processes are known, for instance, from WO 2007 042394 A1, which describes use of doping elements, especially silver, tin, zinc, bismuth and antimony, in ceramic target materials.

However, the disadvantage of doping with metallic elements is that a high level of complexity is necessary to prevent these elements being incorporated into the layer in the course of deposition thereof, and hence enabling electrical conduction in the layer. For example, a separate selective deposition of the metallic element or else of compounds thereof that form during the sputtering process on cooled plates or discs may be necessary.

A process for producing lithium ion electrolyte layers via the provision of essentially conductive target materials is described in US 2009 0159433 A1.

In this process, targets consisting of several different lithium and/or phosphorus compounds (for example $Li_3P$, $Li_3N$ or else $P_2O_3$) are eroded in a reactive sputtering process (DC, pulsed DC, AC or RF) with oxygen and nitrogen, and a lithium ion electrolyte layer is thus produced.

The desired composition of the thin layer produced has to be set here both via the ratios of the different individual chemical compounds in the target material and via the ratio of oxygen to nitrogen in the sputtering atmosphere. This subsequently leads to a high level of complexity in the choice of process parameters, and also in the production of the corresponding target material, which again entails high costs.

In the case of use of a plurality of different chemical compounds in the target material, there is also the risk of deposition of a layer having inhomogeneous properties. This is disadvantageous particularly for the required constant ionic conductivity of such lithium ion electrolyte layers. In addition, the presence of a plurality of chemical compounds having different thermal conductivities and/or coefficients of thermal expansion results in reduced thermal shock stability, which can subsequently have an adverse effect on the mechanical strength of the target material.

A further disadvantage in the case of use of a plurality of different chemical compounds in a target material is the occurrence of different sputtering rates of the various compounds. This can make it difficult to deposit layers having constant thickness.

BRIEF SUMMARY OF THE INVENTION

Accordingly, it is an object of the present invention to provide a conductive target material suitable for deposition of lithium ion electrolyte layers by means of DC or pulsed DC sputtering.

The desired chemical composition of the layer to be deposited is to be easy to set and homogeneous over the layer. In addition, the conductive target material is to have a high thermal shock stability, and also high process stability, and ensure low costs as a result. The disadvantages mentioned are to be avoided.

The object is achieved by a conductive target material and by a process for producing a conductive target material as described below. Advantageous developments of the invention are apparent from the dependent claims.

An inventive conductive target material comprises essentially one lithium compound and carbon, and also typical impurities. It is characterized in that the carbon present occurs predominantly, with a proportion of greater than 50%, in elemental form.

"Essentially one lithium compound" or "substantially one lithium compound" is understood here to mean that the target material comprises mainly one lithium compound which preferably assumes a proportion of greater than or equal to 80% by area on a cut surface of the target material.

The term "lithium compound" here includes all the crystalline and amorphous compounds of lithium, which may be present either in stoichiometric or non-stoichiometric form. Examples of lithium compounds usable for implementation of the invention are lithium phosphate ($Li_3PO_4$), lithium carbonate ($Li_2CO_3$), but also $Li_2SO_4$, $Li_7La_3Zr_2O_{12}$, $Li_3P$, $Li_2O$, $Li_3N$, $LiBO_2$, LiI or LiBP.

For the determination of the proportion of the essentially one lithium compound by area, measured on a cut surface of the conductive target material, a metallographic section is produced and analysed by light microscopy or electron microscopy. By means of commercially available image analysis software, it is possible to conduct area analyses on microscope images thus produced. This is effected via an image analysis for determination of individual phase components of said microstructure, typically via contrasting of the phases to be distinguished.

The lithium compound lithium phosphate ($Li_3PO_4$) has been found to be particularly advantageous for use in an inventive conductive target material, since particularly high deposition rates can thus be achieved in the production of lithium ion electrolyte layers. For this reason, in preferred embodiments of the invention, the essentially one lithium compound is lithium phosphate.

Preferably, an inventive conductive target material thus comprises lithium phosphate and carbon, and also typical impurities. It is characterized in that the carbon present occurs predominantly, with a proportion of greater than 50%, in elemental form.

It is further preferable when the carbon present in an inventive conductive target material occurs in elemental form with a proportion of greater than 75%.

It is further preferable when the carbon present occurs in elemental form with a proportion of greater than 90%.

It is further preferable when the carbon present occurs in elemental form with a proportion of greater than 95%.

It is further preferable when the carbon present occurs in elemental form with a proportion of greater than 99%.

It is especially preferable when the carbon present occurs exclusively in elemental form with negligible proportions dissolved in the essentially one lithium compound, preferably lithium phosphate.

"Typical impurities" refer to production-related contaminations by gases or accompanying elements which originate from the raw materials used. The proportion of such impurities in an inventive conductive target material is in the region of below 1000 ppm. As is well known, suitable processes for chemical element analysis depend on the chemical element to be analysed. For the chemical analysis of an inventive conductive target material, ICP-OES (optical emission spectrometry with inductively coupled plasma), RFA (X-ray fluorescence analysis) and GDMS (glow discharge mass spectrometry) are used.

The elemental form of carbon refers here to pure carbon, for example in the form of graphite. The carbon present in an inventive conductive target material is thus preferably dissolved to a small extent or only to a negligible degree in the essentially one lithium compound, preferably lithium phosphate, and also forms only negligibly small amounts, if any, of additional chemical compounds.

Further manifestations of elemental carbon are, for example, diamond, fullerenes or else amorphous carbon, but other crystal structures and $sp^2:sp^3$ hybridization ratios should also be regarded as elemental carbon in the context of the present invention.

The elemental form of the carbon present in an inventive target material avoids the above-described disadvantages of several different chemical compounds in the target material.

In an inventive target material, the carbon thus forms a separate component of the microstructure and is not a main constituent of another component of the microstructure. This form of the carbon results in the significant increase in the electrical conductivity of an inventive conductive target material.

A proportion of the carbon that occurs in elemental form is understood here to mean the ratio to all the carbon present in the target material.

The higher the proportion of the carbon that occurs in elemental form, the higher the electrical and thermal conductivity achievable with a particular carbon content (for example in at %) in an inventive target material.

An inventive conductive target material preferably comprises at least one carbon cluster that percolates from one side of the target material to an opposite side of the target material.

A percolating carbon cluster of this kind is responsible for the significant increase in electrical conductivity compared to a conventional target material without a percolating carbon cluster, since electrical current can flow along the at least one percolating carbon cluster from one side of the conductive target material to another side of the conductive target material.

A percolating carbon cluster of this kind should be understood to be a portion of all the carbon present in an inventive target material, and consequently consists preferably of elemental carbon.

Percolating clusters are a central term from percolation theory, which is known to those skilled in the art as a means of describing phenomena such as electrical conductivities of alloys, for example. A cluster is referred to as percolating when it connects opposite edges of the embedding space.

An inventive conductive target material has a preferably biphasic microstructure in which carbon is arranged in the manner of a network around the regions rich in the essentially one lithium compound, preferably lithium phosphate-rich regions.

Microstructure is understood here to mean the arrangement of the specific components (phases) of the target material. The microstructure of a material can be visualized by customary methods, by means of a light microscope or scanning electron microscope (SEM), for example after producing a metallographic section.

FIG. 1 shows, by way of example, a light microscope image of the microstructure of an inventive conductive target material. This shows: regions rich in the essentially one lithium compound, in this case lithium phosphate-rich regions 1, regions of elemental carbon 2, and a portion of a percolating carbon cluster 3 corresponding to the image section.

"Biphasic" is understood here to mean that at least two different components (phases), characterized by different chemical composition and/or crystal structure, are present in the inventive conductive target material. In the case of an inventive conductive target material comprising essentially one lithium compound, preferably lithium phosphate, and carbon, and also typical impurities, the essentially one lithium compound, preferably lithium phosphate, forms the first phase and elemental carbon the second phase of the preferably biphasic microstructure. Small proportions of typical impurities should not be regarded here as further phases in relation to the preferably biphasic microstructure of the inventive conductive target material.

In embodiments of the invention, the microstructure of a conductive target material, as well as the essentially one lithium compound, preferably lithium phosphate, and carbon, may also comprise small proportions of further lithium compounds, for example lithium carbonate ($Li_2CO_3$). Such compounds may either already be present in the starting powder in a small amount or form in the course of the production process, for example in the course of compaction. Such small proportions of further lithium compounds should not be regarded as further phases in relation to the preferably biphasic microstructure of the inventive conductive target material either.

The occurrence of such compounds can possibly be detected or ruled out by means of x-ray diffractometry (XRD) using the relevant JCPDS cards (taking account of the respective x-ray crystallography detection limit). The presence of the preferably biphasic microstructure can also be determined by this method.

FIG. 2 shows, by way of example, a phase determination by means of x-ray diffraction (XRD) of an inventive conductive target material (JCPDS cards used: $Li_3PO_4$: 00-015-0760; carbon (graphite) 00-023-0064; $Li_2CO_3$: 00-022-1141).

In an inventive conductive target material, at least two mutually distinguishable components (phases) are thus present. The majority of the microstructure consists of essentially one lithium compound, preferably lithium phosphate, which occurs as homogeneous two-dimensional regions when viewed in a microscope.

Arranged in the manner of a network around these two-dimensional regions is elemental carbon, a network here referring to a preferably coherent form of the carbon. The extent to which this network forms in the production process can be influenced via the choice of particle sizes of the starting powders used, and the mixing operation conducted.

In addition, the content (for example in at %) of added carbon in combination with the particle sizes of the starting powders used also influences the formation of the network and three-dimensional—and hence visible two-dimensional—extent of the regions of essentially one lithium compound, preferably lithium phosphate regions, and carbon regions that form.

For example, given the same carbon content, the smaller the selected particle size of the starting powders, especially of the essentially one lithium compound, preferably of lithium phosphate, the more difficult it is for a network to form.

Typically, the microstructure of an inventive conductive target material is analysed in two-dimensional sections through the three-dimensional target material. The three-dimensional microstructure of an inventive conductive target material is essentially isotropic, meaning that there are essentially no differences, if any, in the microstructure in relation to the viewing plane, and no directional dependence of the material properties.

An inventive conductive target material preferably has a proportion of carbon by area, measured on a cut surface of the target material, of between 3% and 20%.

For the determination of the proportion of carbon by area, measured on a cut surface of the conductive target material, a metallographic section is produced and analysed by light microscopy or electron microscopy. By means of commercially available image analysis software, it is possible to conduct area analyses on microscope images thus produced. This is effected via an image analysis for determination of individual phase components of said microstructure, typically via contrasting of the phases to be distinguished.

If the proportion of carbon by area, measured on a cut surface of the target material, is below 3%, the desired electrical properties of the target material are no longer achieved to an optimal degree. A further disadvantage of excessively low proportions of carbon by area of below 3% is reduced processability, particularly in the case of production via spark plasma sintering (SPS).

Proportions of carbon by area of more than 20% already lead to increased incorporation of carbon into the layer deposited by means of the conductive target material. As a result of this, it may be the case that the desired layer properties can no longer be achieved to an optimal degree.

Preference is further given to a proportion of carbon by area, measured on a cut surface of the inventive conductive target material, of 5 to 15%. Within this range, the achievable combinations of properties are particularly advantageous, and it is possible to achieve a particularly high power input and deposition rate. More particularly, this is ensured by removal of heat optimized within this preferred range for the measured proportion of carbon by area during the sputtering process.

An inventive conductive target material preferably contains between 3 and 20 at % of carbon.

The carbon content in at % of an inventive conductive target material is set via a conversion to wt % and the starting weight of the appropriate amount of powder. In the finished target material, the carbon content in at % can be checked or detected via a hot gas extraction (also combustion analysis). This involves incinerating the carbon present at temperatures of <1600° C. in an alumina crucible in the oxygen stream and determining it in the form of its oxides by means of an infrared cell.

At carbon contents below 3 at %, reduced processability is already possible in production, especially in the case of manufacture by means of spark plasma sintering (SPS). At carbon contents exceeding 20 at %, there may already be increased introduction of carbon into the layer deposited by means of a conductive target material. As a result of this, it may be the case that the desired layer properties can no longer be achieved in an optimal manner.

Preference is further given to carbon contents in the inventive conductive target material of 5 to 15 at %. Over and above contents of about 5 at %, the electrical conductivity achieved is already sufficiently high that a 5- to 10-fold increase in the deposition rate can be achieved. Given additional optimization of the sputtering process, a further increase in the achievable deposition rates may also be possible.

The addition of carbon in the contents described additionally adjusts the thermal conductivity of the powder mixture during the production of an inventive conductive target material, and hence achieves better compactability.

The electrical conductivity of an inventive conductive target material is preferably at least 0.01 S/mm.

An electrical conductivity of preferably at least 0.01 S/mm ensures that the target material can be deposited by means of a DC or pulsed DC sputtering process. This can achieve deposition rates which are 5 to 10 times those achieved in RF sputtering processes. The times needed for the deposition of a lithium ion electrolyte layer having a particular required thickness can be greatly reduced as a result, and hence the costs that arise can be drastically lowered.

Preference is further given to an electrical conductivity of the inventive conductive target material of at least 0.02 S/mm.

It is thus possible to further increase the deposition rates achieved and further lower the costs of a deposition process.

The electrical conductivity can be measured in a simple manner with conventional instruments by means of transport measurement, for example a four-point measurement, and describes the ability of a material to conduct electrical current.

The thermal diffusivity of an inventive conductive target material is preferably at least 2.5 $mm^2/s$.

This increased thermal diffusivity of an inventive conductive target material compared to pure lithium compounds, for example lithium phosphate ($Li_3PO_4$), enables a higher power input during the sputtering process, since the heat that arises within the target material can be removed more quickly and the temperature established within the target material is lowered.

Preference is further given to a thermal diffusivity of an inventive conductive target material of at least 3 mm²/s, since it is thus possible to further increase the power input into the target material.

These values for thermal diffusivity apply to room temperature.

Typically, the thermal diffusivity decreases with rising temperature. However, it is also advantageous when the thermal diffusivity of an inventive conductive target material is at least 1.5 mm²/s even at typical use temperatures of such a material of between 100 to 250° C.

Thermal diffusivity can be determined in a simple manner by means of a laser flash method, and is the property of a particular material that describes the change in the spatial temperature distribution with time resulting from conduction of heat as a consequence of a temperature gradient.

An inventive conductive target material preferably has a coefficient of thermal expansion of between 10 and 20 ppm/K.

This range of values is attained both at room temperature and at typical use temperatures of an inventive target material of about 100 to 250° C. In comparison, for example, pure monophasic lithium phosphate ($Li_3PO_4$) has a coefficient of thermal expansion of about 2 ppm/K at room temperature, which is not increased significantly even at elevated temperatures.

The elevated coefficient of thermal expansion of an inventive conductive target material is matched to those materials that are typical for support elements, for example a copper backplate (coefficient of thermal expansion of copper about 16 ppm/K). This matching of the coefficient of thermal expansion ensures increased thermal shock resistance and temperature swing stability of the target material during use. In addition, flaking of the target material after optional bonding to a support element (optional bonding step) is very substantially avoided as a result.

The coefficient of thermal expansion of an inventive target material can be determined in a simple manner by means of a dilatometer measurement.

A further advantage of the optimized thermal properties of an inventive target material is the use of higher-melting solder materials that this enables, for example Sn for a bond (optional bonding step) to a support element. This can further increase the power input in the sputtering process.

The relative density of an inventive conductive target material is preferably at least 95%. Preference is further given to a relative density of at least 99%. The higher the relative density of the conductive target material, the more advantageous properties thereof are. Target materials having relatively densities below 95% have a porous structure which can act as a virtual leak, and as a source of impurities. In addition, target materials having too low a relative density have a tendency to absorb water and other impurities, which can subsequently lead to a deposition process that is difficult to control.

As is well known, relative density can be determined in a simple manner via Archimedes' principle by means of buoyancy methods.

The mechanical strength of an inventive conductive target material is preferably sufficiently high to ensure possible mechanical processing in the course of the production process.

An inventive conductive target material is preferably intended for use for deposition of a lithium ion electrolyte layer for a thin-film battery.

The intended use for deposition of a lithium ion electrolyte layer for a thin-film battery in different manufacturing plants, and for different geometries of the substrates to be coated, places various geometric demands on an inventive conductive target material. Accordingly, such a material may be in the form of a plate, of a disc, of a bar, of a tube, or of another three-dimensional body of complex shape. Such a body of complex shape may, for example, have the form of a pot or of a hollow cathode.

The lithium ion electrolyte layers deposited with an inventive target material are to have only a very low electrical conductivity, or preferably be electrically insulating. The suitability of such a layer as an electrolyte is apparent from its ion conductivity. Accordingly, the carbon present in an inventive conductive target material must essentially not be incorporated, if at all, into the deposited layer. Preferably, the carbon present is bound in the form of CO or $CO_2$ by the oxygen present in the residual gases in the sputtering atmosphere and is pumped out as a result. The carbon content in the layer deposited can be reduced even further by an optional reactive sputtering step. In this way, the function of the lithium ion electrolyte layers deposited with an inventive target material is not impaired by the carbon present in the target material.

A process for producing an inventive conductive target material from essentially one lithium compound and carbon, and also typical impurities, preferably comprises the following steps:
  producing a powder mixture comprising essentially one lithium compound and carbon
  introducing the powder mixture into a mould
  compacting the powder mixture by means of pressure and/or temperature.

Since it has been found that the lithium compound lithium phosphate ($Li_3PO_4$) is particularly advantageous for use in an inventive conductive target material, the essentially one lithium compound used for the production of a powder mixture, for use in a process according to the invention, is also preferably lithium phosphate.

Accordingly, in preferred embodiments of the invention, the process for producing a conductive target material from lithium phosphate and carbon, and also typical impurities, preferably comprises the following steps:
  producing a powder mixture of lithium phosphate and carbon
  introducing the powder mixture into a mould
  compacting the powder mixture by means of pressure and/or temperature.

The production of a powder mixture for an inventive conductive target material is effected by the weighing of the amounts of powder required and mixing in a suitable mixing unit until a homogeneous distribution of the components in the powder mixture is assured.

The powder mixture thus produced is introduced into a mould which, in accordance with the subsequent compaction step, may have various three-dimensional measurements and be produced from different materials. Typical materials for such moulds are, for example, graphite, CFC (carbon fibre-reinforced carbons), Mo or TZM (titanium-zirconium-molybdenum).

The powder mixture introduced into a mould is then compacted; the compaction step can be effected by pressure, by temperature, or else by pressure and temperature.

Suitable processes for the compaction step are, for example, hot pressing and spark plasma sintering (SPS), but other compaction processes are also possible.

Further possible steps which may optionally be present in a process for producing an inventive conductive target material are:

conducting a step of drying the powder and/or the powder mixture mechanical processing bonding of the processed blank to one or more support elements.

Drying of the powder and/or powder mixture, especially of the powder of the essentially one lithium compound used, i.e. preferably of the lithium phosphate powder, ensures that, as experience has shown, water of crystallization present in commercially available powder is dissipated, and hence the oxygen content of the powder and, as a result, of the powder mixture is reduced. This enables more precise control of the chemical composition of the conductive target material, and hence also of the lithium ion electrolyte layer deposited thereby as a result. Optimization of the optimal temperature required for the drying step can be effected, for example, by the performance of a thermogravimetry measurement.

After the powder mixture has been compacted via pressure and/or temperature, a mechanical processing operation on the blank obtained may be required. Such a processing step preferably has to be effected in dry form, since an attack at least on the surface of the blank could take place in the case of wet processing. A mechanical processing operation of this kind, for example by means of turning, milling or grinding, can adjust or narrow down the final geometry of the conductive target material, and also, for example, set a particular desired roughness of the surface thereof.

Such a mechanical processing operation can, as already described, be conducted after the compaction of the powder mixture to give a blank, and also after an optional bonding step, or else as a final processing operation.

An inventive conductive target material can additionally be bonded by a bonding step to one or more appropriate support elements, for example a backplate or a support tube. Such support elements may be manufactured, for example, from Cu, Cu alloys, Ti or Ti alloys. It is also possible to use other materials for production of corresponding support elements. For such a bonding step, preference is given to using elements or alloys having a low melting point, for example indium. In addition, it is optionally possible to use an adhesion promoter, for example WNi, in order to assure better wetting.

The compaction step in a process for producing an inventive conductive target material is preferably effected via hot pressing (HP) or spark plasma sintering (SPS). However, other compaction processes such as hot isostatic pressing (HIP) or cold isostatic pressing (CIP) and subsequent sintering are also possible.

In the case of compaction by means of SPS, the compaction of the powder mixture filled into an appropriate mould is effected via pressure and temperature, with direct heating to sintering temperature in the mould through the introduction of electrical current.

Advantages of the use of SPS for the compaction step are a drastic shortening of the sintering time needed, such that no green body produced prior to sintering is required.

A compaction by means of SPS of an inventive conductive target material preferably takes place at temperatures between 700 and 900° C. However, this does not rule out compaction at temperatures below or above the range specified.

Compaction by means of SPS of an inventive target material preferably takes place at pressures between 10 and 60 bar. However, this does not rule out compaction at pressures below or above the range specified.

In the case of compaction by means of HP, the compaction of the powder mixture filled into the mould is effected via pressure and temperature, with heating to sintering temperature by means of a heated mould, for example a graphite mould.

Compaction by means of HP of an inventive conductive target material preferably takes place between 700 and 900'C. However, this does not rule out compaction at temperatures below or above the range specified.

Preferably, compaction by means of HP of an inventive target material takes place at pressures between 10 and 60 bar. However, this does not rule out compaction at pressures below or above the range specified.

The time needed for the compaction depends on the dimensions of the conductive target material produced in each case, and can be ascertained in a simple manner by means of cycle optimization in the course of implementation of the compaction process.

Further advantages and convenient aspects of the invention are apparent from the description of working examples which follows, with reference to the appended figures.

BRIEF DESCRIPTION OF THE SEVERAL VIEWS OF THE DRAWING

FIG. 1 Microstructure of an inventive conductive target material, light microscope image. This shows: regions rich in essentially one lithium compound, in this case lithium phosphate-rich regions 1, regions of elemental carbon 2, and a portion of a percolating carbon cluster 3 corresponding to the image section FIG. 2 Phase determination by means of x-ray diffraction (XRD) of an inventive conductive target material (JCPDS cards used: $Li_3PO_4$: 00-015-0760; carbon (graphite) 00-023-0064; $Li_2CO_3$: 00-022-1141)

FIG. 3 Conductivity [S/mm] vs. content of carbon introduced [at %] in an inventive target material FIG. 4 Comparison of deposition rate and power input for the inventive conductive target material with the prior art

DESCRIPTION OF THE INVENTION

Working Examples

Example 1

Lithium phosphate powder having a volume-weighted average particle size of 3.64 μm (D50=3.09 μm, D90=6.81 μm) was mixed with 5 at % of carbon powder having a volume flow weighted average particle size of 3.88 μm (D50=3.49 μm, D90=6.81 μm) in a Turbula mixer for 30 minutes. The powder mixture thus obtained was introduced into the graphite mould of a hot press and compacted therein at a temperature of 875° C. and a pressing force of about 3 MPa under an Ar atmosphere for 2 h to give a target material having the dimensions 261×241 mm and thickness 10 mm. The target material thus obtained was cleaned by means of sandblasting and subsequently processed under dry conditions to the final geometry. By means of a step of bonding to a copper backplate, a finished target was produced.

Example 2

Lithium phosphate powder having a volume-weighted average particle size of 3.64 μm (D50=3.09 μm, D90=6.81 μm) was mixed with 10 at % of carbon powder having a volume flow weighted average particle size of 3.88 μm (D50=3.49 μm, D90=6.81 μm) in a Turbula mixer for 30 minutes. The powder mixture thus obtained was introduced into the graphite mould of a spark plasma sintering (SPS) system and compacted therein under a pressure of 20 bar and at a temperature of 875° C., which was maintained over the course of 1 h, to give a disc-shaped target material having a diameter of 73.5 mm and a thickness of 5 mm. The target material thus obtained was subsequently ground to a finish by means of a dry processing step and processed by means of a step of bonding to a copper backplate to give a finished target.

Example 3

A target composed of an inventive conductive target material, produced analogously to Ex. 1 and 2, comprising lithium phosphate and carbon (10 at %), was used to ascertain the deposition rate by conducting a DC sputtering experiment under an Ar atmosphere (pressure $7.5*10^{-3}$ mbar) at a power input of 10 W/cm² of target material. Within a period of 990 s, a layer thickness of 1.5 µm was achieved. A measurement of the electrical conductivity of this layer by means of four-point measurement did not give a measurable conductivity.

The invention claimed is:

1. A conductive target material, consisting of:
   lithium phosphate ($Li_3PO_4$), wherein said lithium phosphate ($Li_3PO_4$) assumes a proportion of greater than or equal to 80% by area on a cut surface of total area of a single conductive target material;
   carbon occurring predominantly with a proportion of greater than 99% of the carbon being graphite and has a proportion of said carbon between 3 and 20 at %; and lithium carbonate ($Li_2CO_3$);
   wherein the lithium phosphate ($Li_3PO_4$) and the carbon form a biphasic microstructure, with the lithium carbonate ($Li_2CO_3$) being present in a small proportion that is not regarded as a further phase in relation to the biphasic microstructure; and
   typical impurities to form said single conductive target material for the deposition of a lithium ion electrolyte layer by a DC or pulsed DC sputtering process, wherein said single conductive target material has a relative density of at least 95%.

2. The conductive target material according to claim 1, wherein said single conductive target material comprises said carbon occurring predominantly with a proportion of greater than 90% being at least one carbon cluster that percolates from one side of said single conductive target material to an opposite side of said single conductive target material.

3. The conductive target material according to claim 1, wherein said single conductive target material has an electrical conductivity of at least 0.01 S/mm.

4. The conductive target material according to claim 1, wherein said single conductive target material has a thermal diffusivity of at least 2.5 mm²/s.

5. The conductive target material according to claim 1, wherein said single conductive target material has a coefficient of thermal expansion of between 10 and 20 ppm/K.

* * * * *